United States Patent [19]

Rosseel et al.

[11] Patent Number: 5,283,479
[45] Date of Patent: Feb. 1, 1994

[54] BICMOS LOGIC GATE HAVING PLURAL LINEARLY OPERATED LOAD FETS

[75] Inventors: Geert Rosseel, Fremont; Bill Herndon, Sunnyvale; James A. Matthews, Milpitas, all of Calif.

[73] Assignee: MicroUnity Systems Engineering, Inc., San Jose, Calif.

[21] Appl. No.: 842,922

[22] Filed: Feb. 27, 1992

Related U.S. Application Data

[63] Continuation-in-part of Ser. No. 693,815, Apr. 30, 1991, Pat. No. 5,124,580.

[51] Int. Cl.$^5$ ............................................. H03K 17/16
[52] U.S. Cl. ..................................... 307/446; 307/443; 307/455; 307/296.6
[58] Field of Search ............... 307/443, 446, 455, 570, 307/296.6

[56] References Cited

U.S. PATENT DOCUMENTS

| | | | |
|---|---|---|---|
| 4,636,665 | 1/1987 | McLaughlin | 307/446 |
| 4,701,642 | 10/1987 | Pricer | 307/446 |
| 4,703,203 | 10/1987 | Gallup et al. | 307/446 |
| 4,713,560 | 12/1987 | Herndon | 307/455 |
| 4,779,014 | 10/1988 | Masuoka et al. | 307/446 |
| 4,808,850 | 2/1989 | Masuda et al. | 307/446 |
| 4,845,385 | 7/1989 | Ruth, Jr. | 307/446 |
| 4,871,928 | 10/1989 | Bushey | 307/446 |
| 4,999,519 | 3/1991 | Kitsukawa et al. | 307/446 |
| 5,093,806 | 3/1992 | Tran | 365/189.06 X |
| 5,124,580 | 6/1992 | Matthews et al. | 307/446 |
| 5,140,191 | 8/1992 | Nogle et al. | 307/443 X |
| 5,155,392 | 10/1992 | Nogle | 307/443 X |

OTHER PUBLICATIONS

"BiCMOS Technology and Applications", edited by Antonio R. Alvarez, Kluwer Academic Publishers, 1990, Chapter 5 (pp. 165-200).

Primary Examiner—David R. Hudspeth

[57] ABSTRACT

An improved BiCMOS logic circuit utilizes an emitter-coupled pair of bipolar transistors for differentially comparing an input signal with a logic reference level. Each of the bipolar transistors are resistively loaded by a network of p-channel metal-oxide-semiconductor (PMOS) transistors coupled in parallel. At least one of the parallel combination of transistors has its gate coupled to a control signal providing a variable load resistance. The control signal is preferably provided by a feedback network which maintains a constant voltage swing across the network over temperature.

34 Claims, 5 Drawing Sheets

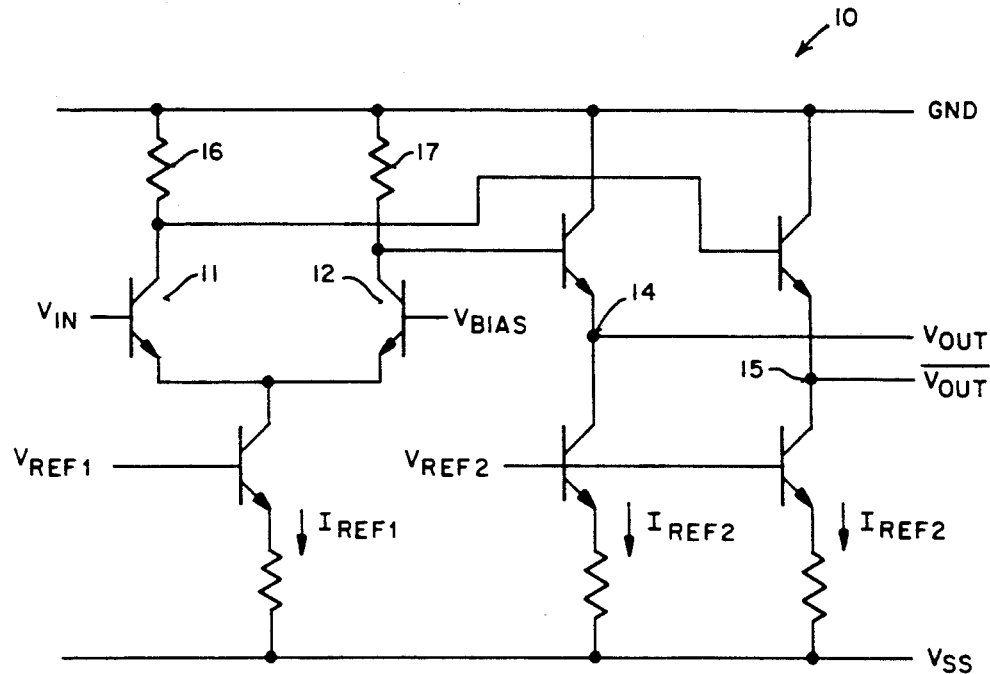
FIG_1 (PRIOR ART)
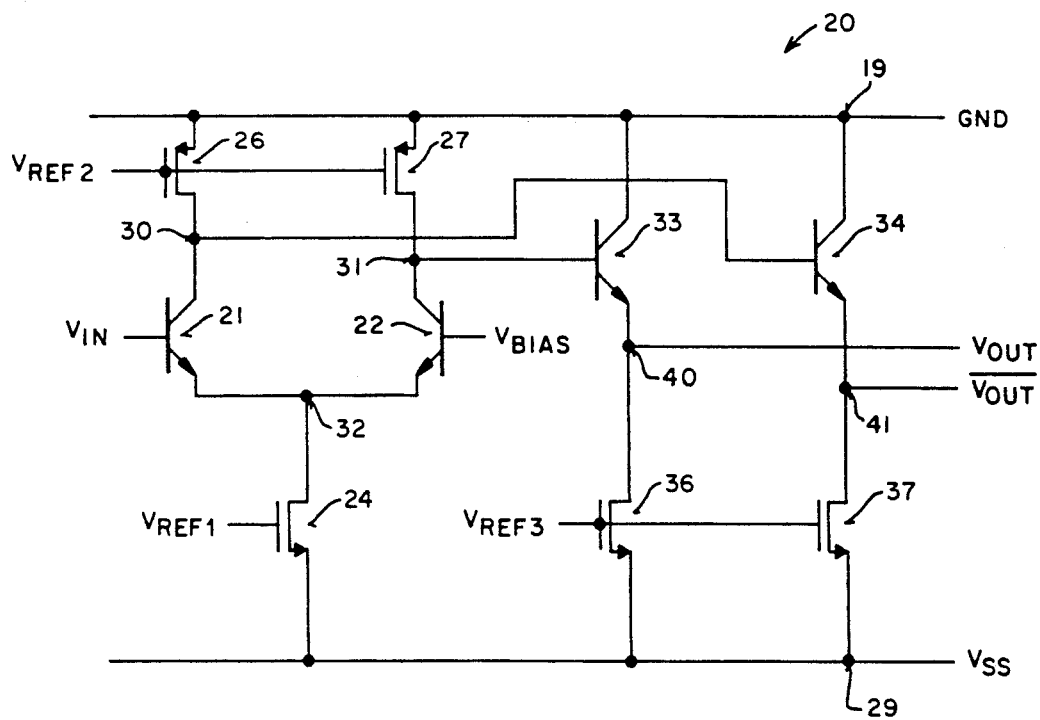
FIG_2

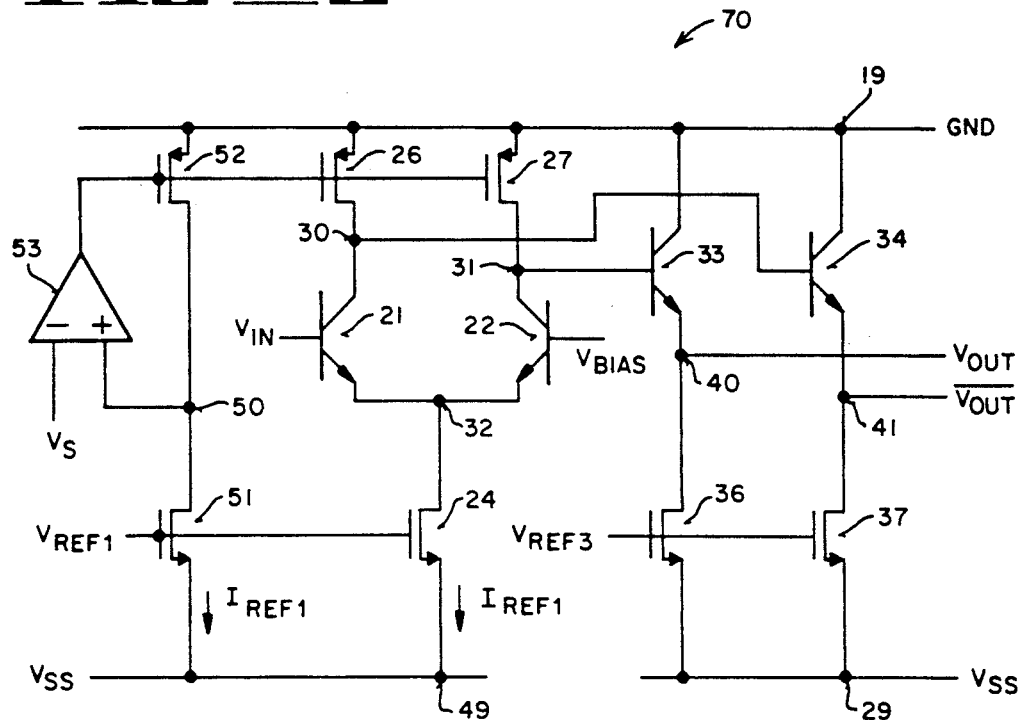
FIG_3
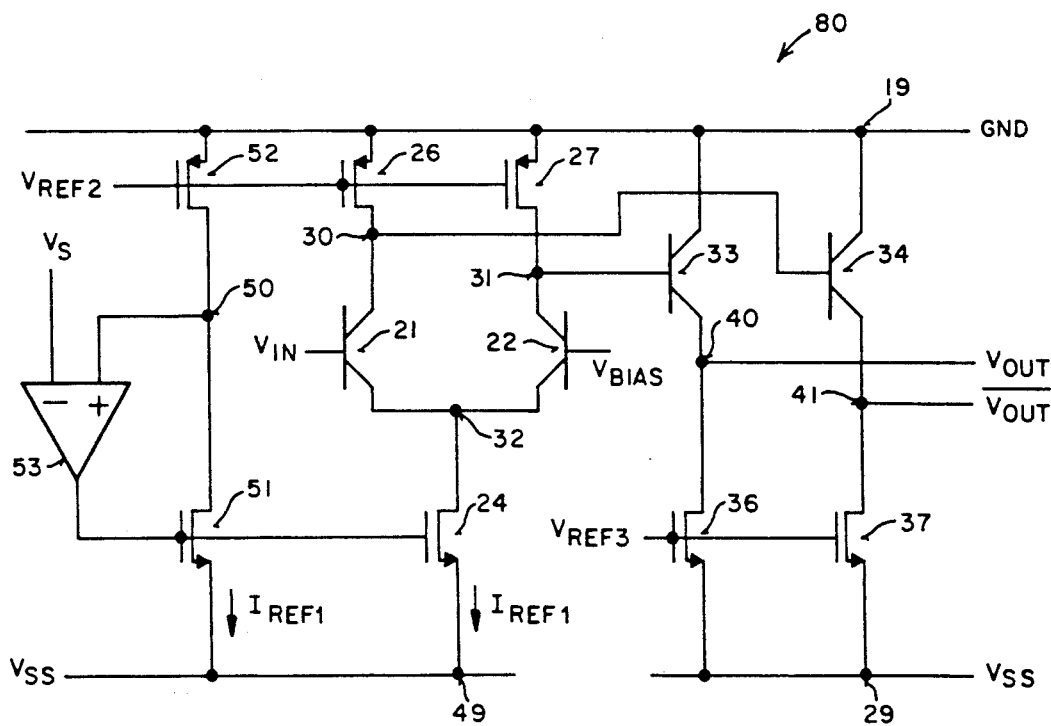
FIG_4

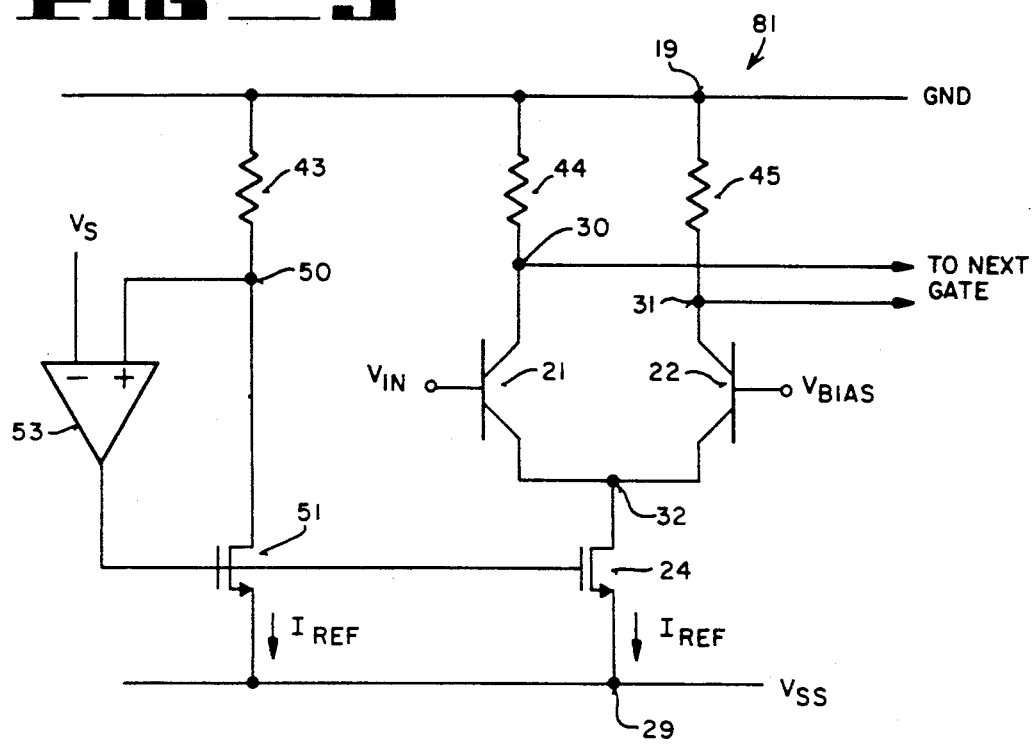
FIG_5
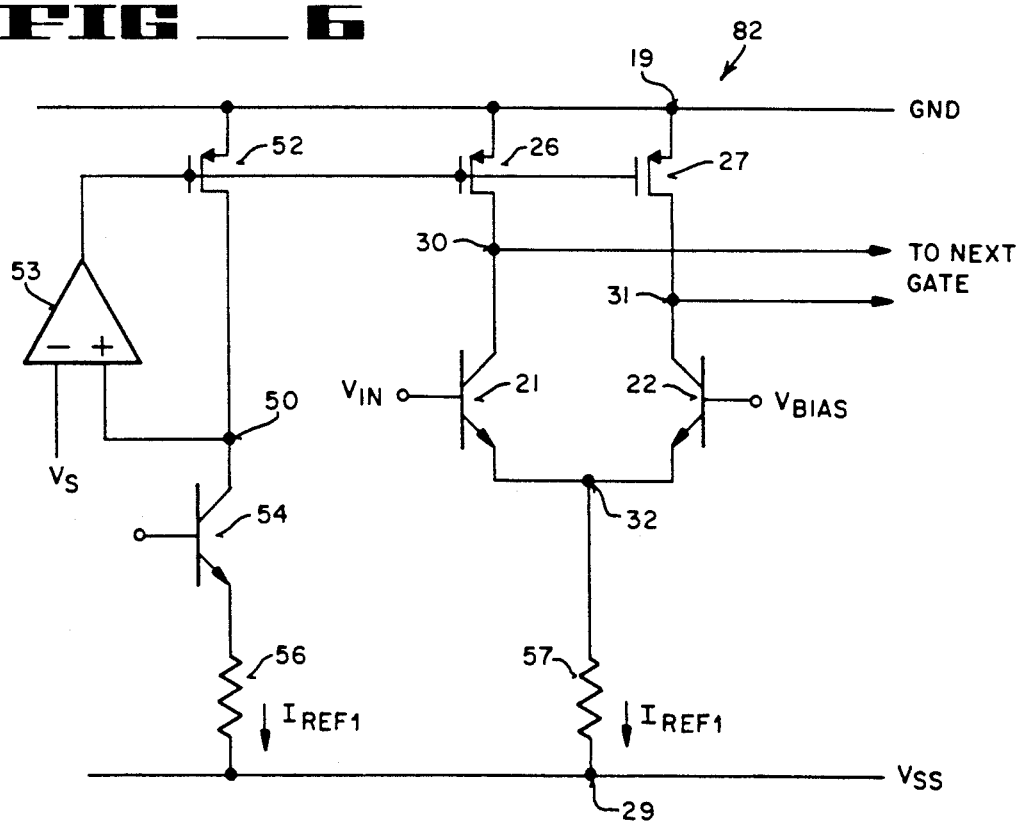
FIG_6

FIG_7
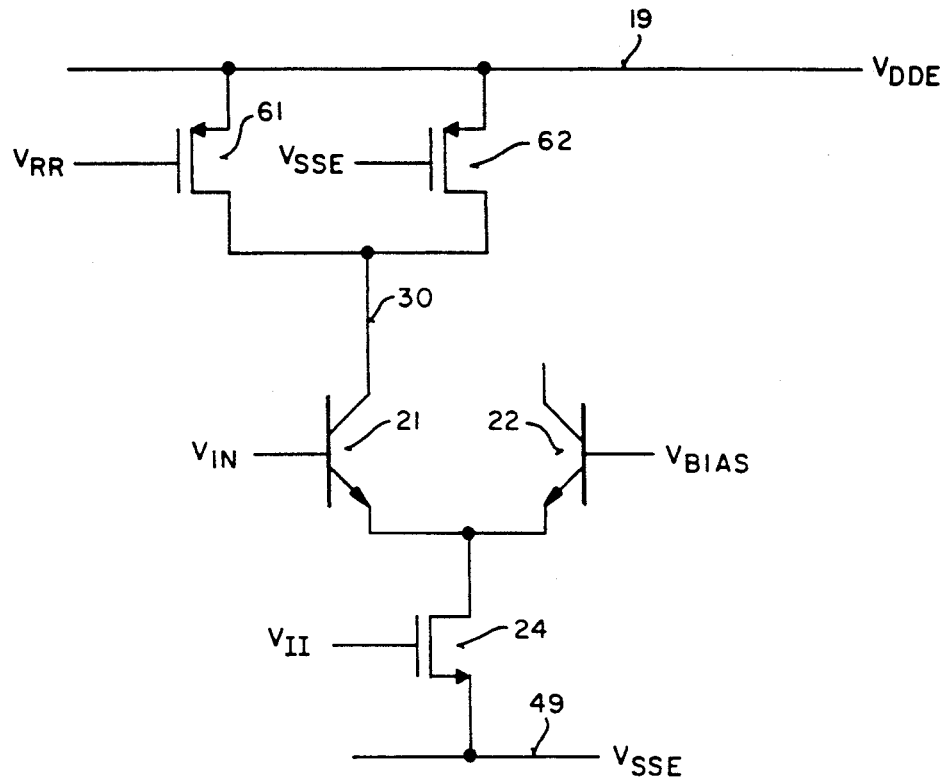
FIG_8
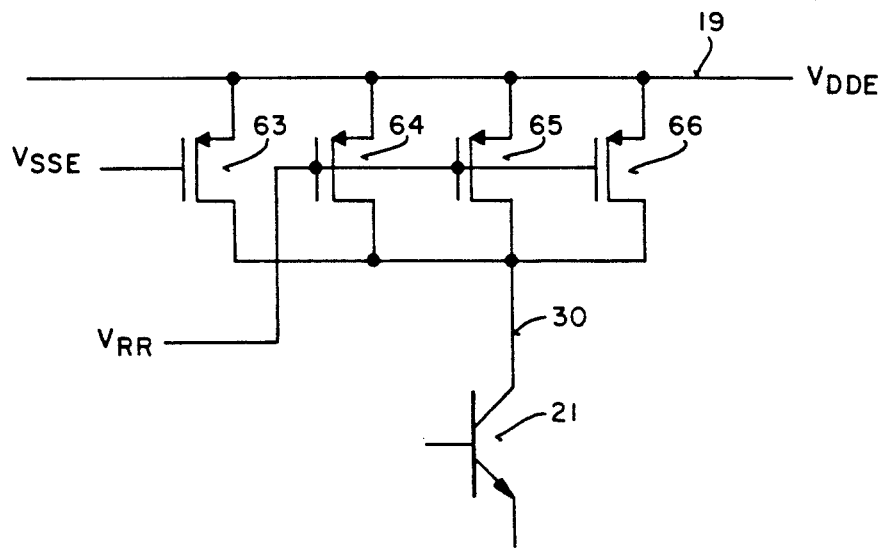

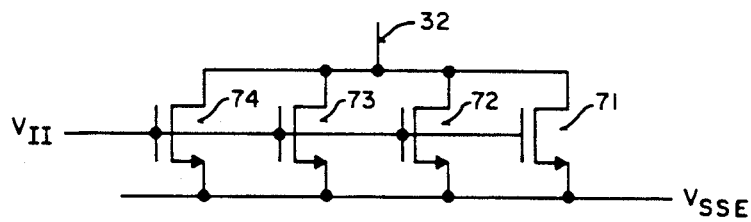
FIG_9
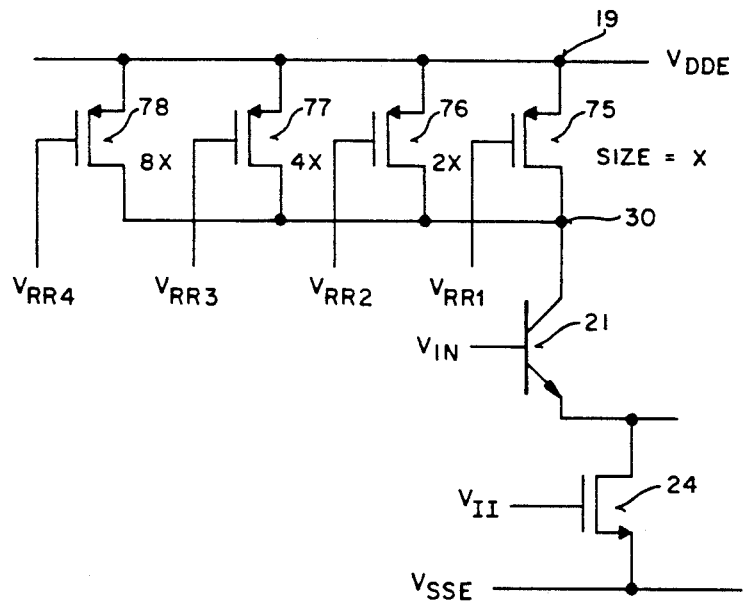
FIG_10
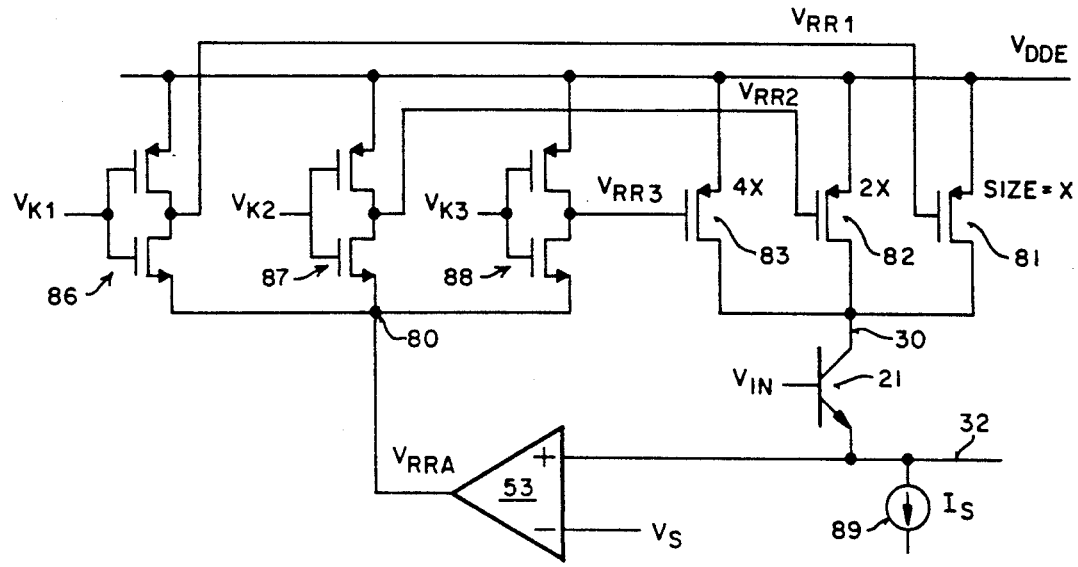
FIG_11

BICMOS LOGIC GATE HAVING PLURAL LINEARLY OPERATED LOAD FETS

RELATED APPLICATIONS

This is a continuation-in-part (CIP) application Ser. No. 693,815, filed Apr. 30, 1991 now U.S. Pat. No. 5,124,580, which application is assigned to the assignee of the present invention.

FIELD OF THE INVENTION

The present invention generally relates to the field of integrated circuits which combine bipolar and complimentary metal-oxide semiconductor (CMOS) devices on the same substrate. More particularly, the invention relates to emitter-coupled-logic (ECL) logic gates implemented using a BiCMOS process technology.

BACKGROUND OF THE INVENTION

Recently, researchers have been directing their attention toward developing digital logic circuits which combine bipolar and CMOS technologies in a single integrated circuit. The marriage of bipolar and CMOS technologies is particularly advantageous since the superior aspects of each may be exploited and combined to yield optimal circuit performance.

For instance, CMOS circuits have the advantages of extremely low quiescent power consumption, rail-to-rail output capability, high density and a very high input impedance. Bipolar logic circuits, on the other hand, are useful in driving large capacitance loads, have very fast switching capabilities and feature better performance over temperature and power supply. These attributes have lead to the development of a family of BiCMOS digital logic circuits which employ bipolar transistors to drive output loads while utilizing CMOS devices to perform the basic logic functions on the received input signals. Digital logic circuits implemented using BiC-MOS technology are discussed in "BiCMOS Technology and Applications", edited by Antonio R. Alvarez, Kluwer Academic Publishers, 1990, Chapter 5 (pages 165-200). Examples of BiCMOS binary logic circuits are also disclosed in U.S. Pat. Nos. 4,701,642; 4,871,928; 4,845,385; 4,703,203; 4,636,665; 4,779,014; and 4,808,850.

Emitter-coupled logic (ECL) is a very well understood family of bipolar logic circuitry. Its popularity stems from the fact that ECL provides the faster bipolar logic available. However, the main drawback is the fact that bipolar ECL gates also consume the most power of conventional logic technologies. Thus, it would be desirable to integrate the high switching speed capabilities of conventional bipolar ECL along with the high-density, low-power characteristics of CMOS circuits. A hybrid ECL/MOS family of logic circuits would be capable of taking advantage of the strengths of the individual technologies.

Unfortunately, past attempts to create BiCMOS ECL logic gates have not been entirely successful. BiCMOS logic gates often have difficulty matching the temperature and supply dependence of ECL circuitry. The complicated temperature dependence of the bipolar transistor counts in large part for the difficulty of interfacing circuitry with CMOS logic stages. While the problem of the bipolar transistor's negative temperature coefficient has been circumvented in fully bipolar ECL logic devices (e.g., the Motorola 100K ECL family), merged ECL/MOS circuits have not been as successful.

Therefore, what is needed is an integrated circuit (IC) combining CMOS and bipolar technologies which implements an ECL compatible logic function. Such a circuit should be capable of compensating for the negative effects of process and temperature variations which are an ordinary part of an IC's operating environment. As will be seen, the present invention provides a novel BiCMOS ECL gate possessing these characteristics. In addition, the invented ECL logic gate features the ability to vary the output voltage swing as well as control the total power dissipation of the circuit.

SUMMARY OF THE INVENTION

An improved BiCMOS logic circuit is described which includes an emitter-coupled pair of bipolar transistors for differentially comparing an input signal with a reference potential. Importantly, each of the bipolar transistors is coupled to a resistive load network which preferably comprises a plurality of p-channel metal-oxide-semiconductor (PMOS) transistors. The PMOS transistors are coupled in parallel between the highest operating potential of the circuit and the collector of the respective bipolar transistor.

In one embodiment, at least one of the PMOS transistors has its gate coupled to the circuit's lowest supply potential to provide a fixed resistance value. At the same time, at least one other of the PMOS transistors has its gate coupled to a control signal providing a variable voltage. The control signal permits the user to select the load resistance value for the parallel combination such that linearity of the circuit is improved.

Preferably, the control signal is generated by a feedback network which includes an operational amplifier. The amplifier adjusts the control signal to maintain a constant logic swing across the resistive load network over a range of temperature, supply and process variations. Coupling a reference voltage to one of the amplifier inputs allows the feedback network to dynamically control the output voltage swing of the circuit.

BRIEF DESCRIPTION OF THE DRAWINGS

The present invention is illustrated by way of example and not limitation in the figures of the accompanying drawings, in which like references indicates similar elements, and wherein;

FIG. 1 is a circuit schematic of a basic prior art bipolar ECL logic gate.

FIG. 2 is a circuit schematic of one embodiment of the invented BiCMOS logic gate.

FIG. 3 is a circuit schematic of an alternative BiCMOS logic circuit which utilizes feedback.

FIG. 4 is yet another alternative BiCMOS logic gate.

FIG. 5 is another invented BiCMOS logic gate.

FIG. 6 is still another alternative BiCMOS logic gate.

FIG. 7 is a circuit schematic diagram of an alternative embodiment which uses multiple PMOS load transistors coupled in parallel for improved linearity.

FIG. 8 illustrates another example in which multiple PMOS load transistors are utilized wherein different gate voltages are employed to provide a linear range of operation.

FIG. 9 illustrates how the concept of employing multiple parallel NMOS devices can be used to improve linearity by providing a bias current for the input differential pair of bipolar devices.

FIG. 10 illustrates the concept of using multiple PMOS devices coupled in parallel wherein each device may be switched independently of the others.

FIG. 11 illustrates a digitally controlled PMOS load transistor switching network which provides an analog low voltage by means of a feedback network.

DETAILED DESCRIPTION

In the following description, an improved BiCMOS logic gate and related circuitry is disclosed in which numerous specific details are set forth, such as specific conductivity types, circuit configurations, voltages, etc., in order to provide a thorough understanding of the present invention. It will be obvious, however, to one skilled in the art that these specific details need not be used to practice the present invention. In other instances, well known structures and circuits have not been shown in detail in order to avoid unnecessarily obscuring the present invention.

DISCUSSION OF THE PRIOR ART

Referring to FIG. 1, there is illustrated a conventional prior art emitter-coupled logic (ECL) gate 10. Gate 10 includes emitter-coupled bipolar transistors 11 and 12 for comparing an input signal $V_{IN}$ with a reference potential $V_{BIAS}$. Reference potential $V_{REF1}$ generates a reference current $I_{REF1}$ which flows either through transistor 11 or transistor 12, depending on the applied input. By way of example, if the voltage $V_{IN}$ exceeds $V_{BIAS}$, then the current $I_{REF1}$ will be steered through transistor 11 and resistor 16. This current flow causes a corresponding voltage drop across resistor 16. At the same time, because no current flows through transistor 12 or resistor 17, the collector node of transistor 12 remains at approximately ground potential.

Of course, any voltage drop appearing across resistor 16 or 17 also appears at the bases of the respective output emitter follower transistors. The output signal $V_{OUT}$ and its compliment $\bar{V}_{OUT}$, are provided at output nodes 14 and 15, respectively. Note that the output emitter follower transistors are biased with a current $I_{REF2}$ generated by a second reference potential, $V_{REF2}$. As previously discussed, one of the main drawbacks of logic gate 10 is its high quiescent operating current. In other words, logic gate 10—although capable of switching at very high speeds—suffers from a correspondingly high power dissipation.

DISCUSSION OF THE PRESENT INVENTION

FIG. 2 illustrates a circuit schematic of a BiCMOS logic gate 20, which represents one embodiment of the present invention. Gate 20 utilizes an emitter-coupled pair of bipolar transistors 21 and 22 for comparing an input signal $V_{IN}$ with a reference potential $V_{BIAS}$. One of the key differences between logic gate 20 of FIG. 2 and the prior art gate of FIG. 1 is that gate 20 is implemented using ordinary BiCMOS technology. Specifically, n-channel metal-oxide-semiconductor (NMOS) transistors 24, 36 and 37 are employed as current sources in gate 20, and p-channel metal-oxide-semiconductor (PMOS) transistors 26 and 27 are employed as load resistors. The magnitude of the current flowing through the emitter-coupled pair is set by the reference voltage, $V_{REF1}$, coupled to the gate of NMOS transistor 24. FIG. 2 shows the source and drain of NMOS transistor 24 being coupled between nodes 29 (e.g., $V_{SS}$) and 32, respectively.

The reference potential $V_{REF3}$, coupled to the gates of transistors 36 and 37, is used to establish the reference current which flows through output emitter follower transistors 33 and 34. In this respect, transistors 36 and 37 function as current sources. As can be seen, the drain of NMOS transistor 36 is coupled to output node 40 (i.e., $V_{OUT}$), while the drain of NMOS transistor 37 is coupled to output node 41 (i.e., $\bar{V}_{OUT}$). Transistors 36 and 37 both have their sources coupled to the lowest operating supply potential (e.g., $V_{SS}$) at node 29.

NMOS transistors 24, 36 and 37 are preferably operated in the saturation region. An advantage of utilizing n-channel field effect devices as current sources in the circuit of FIG. 2 is that the temperature coefficient of the saturation current for these devices is nearly zero. That is, the reference current produced by voltages $V_{REF1}$ and $V_{REF3}$ remains virtually constant over temperature. (Note that circuit 20 may also be configured such that the gates of transistors 24, 36 and 37 are all coupled to a single reference potential.)

PMOS transistors 26 and 27, on the other hand, operate in the linear region as load devices for the emitter coupled pair 21 and 22. The value of the load resistance for each of the PMOS transistors is determined by the reference voltage $V_{REF2}$ (obviously, the size of the PMOS transistors must also be taken into consideration). Observe that voltage $V_{REF2}$ is coupled to the gates of PMOS transistors 26 and 27. Also note that FIG. 2 shows transistor 26 having its source and drain coupled across nodes 19 and 30, while transistor 27 has its source and drain coupled between nodes 19 and 31, respectively.

Utilizing PMOS field-effect devices as load resistors in the circuit of FIG. 2 provides a distinct advantage over prior art designs. Moreover, the resistance of the PMOS devices—when operated in the linear range— can be easily adjusted by changing the potential applied to the gate. In this manner, the resistance of load transistors 26 and 27 can be controlled by means of reference potential $V_{REF2}$. The significance of this is that the effect of variations such as temperature and power supply on the gate output voltage can be offset by proper control of the potential $V_{REF2}$ in accordance with the present invention.

BiCMOS circuit 20 also includes emitter follower transistors 33 and 34, providing outputs $V_{OUT}$ and $\bar{V}_{OUT}$ at nodes 40 and 41, respectively. Transistor 33 has its collector coupled to the positive-most supply node 19 (e.g., ground) and its base coupled to node 31, while transistor 34 has its collector coupled to node 19 and its base to node 30. Both of transistors 33 and 34 are biased by current source NMOS transistors 36 and 37, as discussed previously.

It should be understood that the invented logic gate of FIG. 2 is represented in a simplified form for ease of understanding. It would be obvious to extend the basic circuit diagram of FIG. 2 in order to implement other well known logic gate functions (e.g., OR, NOR, XOR, multi-level logic, latches, etc.). Furthermore, transistors 33, 34, 36 and 37 may be eliminated to transform circuit 20 from an ECL-type logic gate to a common-mode logic (CML) type of gate. When configured as a CML gate, the outputs $V_{OUT}$ and $\bar{V}_{OUT}$ are provided at nodes 31 and 30, respectively, which are then directly coupled to the input nodes of the next gate. Each of these variations and extensions of the circuit of FIG. 2 are considered to be well within the spirit and scope of the present invention.

One means of establishing the reference voltage for the gates of the PMOS load transistors is illustrated by circuit 70 of FIG. 3. The feedback configuration of the embodiment of FIG. 3 is remarkable in that it cancels the effects of temperature, supply voltage and process variations.

BiCMOS logic gate 70 operates in the same manner as gate 20, except that the reference voltage provided to the gates of transistors 26 and 27 is now generated by operational amplifier 53. Amplifier 53 preferably comprises any one of a number of well known CMOS, bipolar or BiCMOS differential amplifiers. In addition to driving devices 26 and 27, amplifier 53 also drives the gate of PMOS transistor 52. Transistor 52 has its source coupled to node 19 and its drain connected to node 50. Node 50 provides the positive input to amplifier 53. The negative input of amplifier 53 is coupled to a reference voltage $V_S$.

The feedback configuration of FIG. 3 also includes an additional NMOS transistor 51. Transistor 51 is shown having its source coupled to $V_{SS}$ node 49 and its drain coupled to node 50. The gate of NMOS transistor 51 is coupled to reference potential $V_{REF1}$. Recall that reference potential $V_{REF1}$ is also used to establish the reference current, $I_{REF1}$, for the input logic switching stage of gate 70. The primary external references in logic circuit 70 are $V_{REF1}$ and $V_{REF3}$ which control the respective currents in the emitter-coupled input transistors 21 and 22, and the output emitter follower transistors 33 and 34. (Reference voltage $V_{BIAS}$ is again coupled to the base of bipolar transistor 22.)

It is appreciated that in most implementations the operating potential provided at node 49 is ordinarily the same as that provided at node 29 (e.g., $V_{SS}$). This means that nodes 49 and 29 are usually tied together. However, certain applications may derive some advantage from having separate supply potentials associated with the input and output stages of logic gate 70.

Preferably, NMOS transistor 51 is matched to NMOS transistor 24 so that the same current (i.e., $I_{REF1}$) flowing through PMOS transistor 52 flows through either of PMOS transistors 26 or 27, depending of the value of the input $V_{IN}$. The matching of currents through these devices can be further improved by connecting a bipolar transistor in series between node 50 and the drain of device 51. The base of this additional bipolar transistor should be coupled to $V_{BIAS}$ is order to insure that the drains of transistors 51 and 24 are at identical potentials.

The idea is to make the drain voltage of NMOS transistor 51 virtually identical to the voltage at node 32, i.e., the drain voltage of transistor 24. If PMOS transistor 52 is matched to transistors 26 and 27, amplifier 53 automatically adjusts the gate voltage of transistors 26 and 27 such that their current voltage characteristics are the same as that of transistor 52. Under such conditions—and depending upon which of the transistors 21 or 22 the current $I_{REF1}$ is flowing—the voltage at either node 30 or 31 is forced to be equal to $V_S$. When configured in this manner, amplifier 53 automatically adjusts the gate voltage of transistors 52, 26 and 27 in response to the voltage appearing at node 50, such that the drain voltage of these transistors is forced to be equal to $V_S$.

Suppose that the drain voltage of reference PMOS transistor 52 drops to a lower value because of some variation in power supply voltage, temperature, etc. Any change in the potential at node 50 causes a corresponding change in the differential voltage presented to operational amplifier 53. In response, amplifier 53 drives its output to a lower voltage which, in turn, reduces the "on" load resistance of PMOS transistor 52 (and also transistors 26 and 27). The lower gate potential applied to transistor 52 causes the drain voltage of transistor 52 (i.e., node 50) to move to a higher value. It does this until the feedback loop is again balanced. Hence, the feedback configuration of logic gate 70 compensates for the negative effects of process, temperature and power supply variations.

It is, of course, crucial that the same gate voltage applied to PMOS transistor 52 be also applied to the gates of load transistors 26 and 27. Coupling the output of amplifier 53 to the gates of all three PMOS transistors, and providing a feedback voltage from node 50, permits the ECL gate of FIG. 3 to maintain a constant output voltage swing independent of any external variations. The value of the swing appearing across nodes 30 and 31 (or nodes 40 and 41) is equal to the reference potential $V_S$.

Another alternative is to scale the device sizes in the circuit of FIG. 3. By way of example, the width of transistor 24 can be scaled relative to the width of transistor 51. At the same time the width of transistors 26 and 27 can be scaled to the width of transistor 52 such that the current through transistor 24 (and transistors 26 or 27) is scaled relative to the current through transistors 51 and 52. In this case, the low voltage at nodes 30 or 31 is still forced to be equal to $V_S$.

Yet another alternative is to alter the circuit design of FIG. 3 such that the low voltage at nodes 30 or 31 is forced to be some ratio of the voltage $V_S$. For example, this may be accomplished by changing the ratio of transistors 26 and 27 to transistor 52 relative to the ratio of transistor 24 to 51. In this way, the low voltage at nodes 30 or 31 can be designed to be some predetermined ratio of $V_S$.

It should be apparent that due to the feedback configuration of gate 70, that the voltage swing at the output of the ECL gate is easily controlled by adjustment of the reference potential $V_S$. That is, the output logic swing levels can be changed in real-time by appropriate control of $V_S$. In conventional logic circuits, the output swing is set during the fabrication of the device and cannot be changed thereafter. However, in the case of the circuit of FIG. 3, it is possible to change the output swing during operation of the device. This feature is a great benefit for circuits which may require more or less switching sensitivity, or when driving non-ECL compatible circuitry.

An additional feature of the present invention is the fact that the power consumption of BiCMOS logic gate 70 is easily controlled by adjustment of the reference potential $V_{REF1}$. As $V_{REF1}$ is increased, the switching speed of the circuit increases accordingly. At the same time, the feedback nature of the circuit keeps the output voltage swing constant (as set by $V_S$). Note that the voltage swing $V_S$ is independent of the current dissipated in logic gate 70. Thus, power dissipation and switching speed are factors which may be controlled and/or continuously varied in accordance with the present invention. This permits a wide range of applications beyond that of ordinary prior art logic gates.

The present invention also overcomes the prior art problem of proper control of $V_{OL}$ (output low voltage). In prior art circuits, $V_{OL}$ is commonly adversely affected by local noise on the $V_{SS}$ supply lines. On the other hand, logic gate 70 has a low output voltage level which is independent of changes in the supply—$V_{OL}$ being completely determined by $V_S$.

FIG. 4 illustrates an alternative embodiment of the present invention in which feedback amplifier 53 drives the gates of NMOS transistors 51 and 24, rather than transistors 52, 26 and 27. Once again, the positive input of amplifier 53 is coupled to node 50 while the negative input is connected to reference voltage $V_S$. The gates of PMOS transistors 52, 26 and 27 are shown being coupled to external reference potential $V_{REF2}$.

In the embodiment of FIG. 4, the gate voltage of the PMOS load transistors is driven externally while the gate voltage of current source NMOS transistors 51 and 24 is automatically adjusted by feedback amplifier 53 to maintain the voltage swing of the ECL gate. As before, the output voltage swing at either of nodes 30 and 31 (or 40 and 41) is equal to $V_S$. In all other respects, the embodiment of FIG. 4 operates analogously to that described previously in connection with FIGS. 2 and 3.

Instead of compensating the load resistance values of PMOS transistors 26 and 27 to maintain the output voltage swing independent of external variations, the circuit of FIG. 4 achieves the same end by changing the bias voltage applied to transistors 51 and 24. Transistors 51 and 24, of course, establish the current flow through devices 52 and 26 or 27. Thus, while gate 70 focused on the resistance provided by transistors 26 and 27, the circuit of FIG. 4 concentrates on adjusting the currents $I_{REF1}$, by altering the bias potential supplied to the current sources comprising transistors 51 and 24. Both embodiments rely upon feedback to cancel the effects of temperature, power supply, and process variations.

Logic gate 81 of FIG. 5 illustrates how the feedback concept explained above can be utilized in a integrated circuit which uses ordinary resistors in place of PMOS load transistors. In circuit 81, matched resistors 43, 44 and 45 replace respective transistors 52, 26 and 27 from the corresponding circuit of FIG. 4. FIG. 5 also illustrates CML operating principles, wherein the emitter follower output transistors are omitted and the output of gate 81 is provided at nodes 30 and 31. These nodes can then be coupled directly to an input of another gate consistent with the CML logic family.

Still another embodiment of the present invention is shown in FIG. 6. Logic gate 82 of FIG. 6 operates analogously to gate 70 of FIG. 3, except that transistors 51 and 24 are shown being replaced by matched resistors 56 and 57. Also, bipolar transistor 54 is included in series between node 50 and resistor 56 for the purpose of insuring that identical currents $I_{REF1}$ flow through the switching and reference stages of gate 82 (see earlier discussion with respect to FIG. 3). The base of transistor 54 is coupled to reference potential $V_{BIAS}$. BiCMOS logic gate 82 is also configured as a CML gate.

IMPROVED LINEARITY

The implementation of ECL/CML circuitry with single PMOS transistors serving as electronically variable load resistors, as illustrated by the embodiments of FIGS. 1-6, has potential disadvantages. In these embodiments, there is a possibility of nonlinearity of the load at the low current end of its operation. The nonlinearity is caused by the reduction of the gate voltage of the PMOS transistor such that the gate voltage approaches the low logic level, and the transistor moves from the linear triode region of operation to the saturated region.

The main drawbacks of such nonlinearity include (1) an excessive fall time in the switching of the output signal due to the increasing time constant of the load resistor, and (2) a reduction in the predictability of scaled voltages when the voltages are scaled to be something other than the voltage $V_S$ of the control circuit. The improved circuitry illustrated in FIGS. 7-11 alleviates the problem of nonlinearity of PMOS load devices, as well as providing other advantages and benefits, to be discussed shortly.

With reference specifically to FIG. 7, there is shown a pair of PMOS transistors 61 and 62 coupled in parallel between supply line 59 (labeled $V_{DDE}$) and node 30 coupled to the collector of bipolar switching transistor 21. Together, transistors 21 and 22 form a differential pair which switch the current produced by NMOS transistor 24. Transistor 24 functions as a current source with its gate being coupled to a constant bias potential $V_{II}$, and its source being coupled to the most negative supply potential, $V_{SSE}$, along line 49.

As described earlier, one of the drawbacks of the embodiments of FIGS. 1-6 is that when the gate voltage of the PMOS load transistor goes too high, the device goes into saturation and the resistor becomes very non-linear. A solution to this problem is illustrated in FIG. 7 wherein PMOS load transistor 62 is shown having its gate coupled to negative supply potential $V_{SSE}$. Connecting transistor 62 in this manner creates a fixed resistance value between supply line 59 and node 30. At the same time, PMOS load transistor 61 has its gate coupled to a distributed bias potential labeled $V_{RR}$. Bias potential $V_{RR}$ is a controlled voltage throughout the circuit which provides a precise, controlled resistance value by means of transistor 61.

Preferably, the bias voltage $V_{RR}$ is generated by a feedback network (such as that shown in FIG. 3) which provides compensation over a range of temperature, supply, and process variations. Alternatively, $V_{RR}$ can be generated by an ordinary reference circuit.

Practitioners in the art will appreciate that there exist a number of alternative embodiments of the basic circuit shown in FIG. 7. For example, the width (i.e., conductance) of transistor 61 may be made large relative to the width of transistor 62. For this situation, coupling the gate of transistor 62 to $V_{SSE}$ provides a small, relatively linear conductance in parallel with the conductance of transistor 61. The result is a substantial improvement in the linearity of the composite load for values of $V_{RR}$ which drive transistor 61 close to saturation.

Similarly, the gate of transistor 62 can be switched between $V_{SSE}$ and $V_{DDE}$ to further extend the linear range of operation of transistor 61. Alternatively, the gate of transistor 62 can be switched between VSSE and VRR while the gate of transistor 61 is switched between VRR and VDDE. This provides the $V_{RR}$ feedback mechanism with two widely separated regions of current operation.

It should also be appreciated that the resistive load configuration shown in FIG. 7 has the potential for numerous alternations. By way of example, transistor 62 may be replaced by a fixed value semiconductor resistor.

In another variation, the width (i.e., conductance) of transistor 61 is made small relative to the width of transistor 62. This configuration provides a minimum area implementation with transistor 61 providing the feedback to maintain independence from temperature and power supply variations. Similarly, transistor 62 may be replaced with a fixed value semiconductor resistor, wherein transistor 61 provides the necessary feedback which maintains independence from temperature and power supply variations.

Note that the relative resistance values of PMOS devices 61 and 62 can also vary within a wide range of values while still preserving linear operation. The essential concept is that by providing a parallel combination of PMOS load resistances, greater linearity, and greater control of that linearity can be achieved.

One such alternative is shown in the circuit schematic diagram of FIG. 8. In FIG. 8, transistors 64–66 are shown having their gates coupled to control voltage $V_{RR}$ while transistor 63 has its gate coupled to the negative supply potential $V_{SSE}$. In this configuration, transistor 63 provides a fixed resistance value. At the same time, the parallel combination of devices 64–66 provide a variable resistance since their gates are connected to $V_{RR}$, an analog voltage preferably determined by a feedback network such as that described earlier in conjunction with FIG. 3. Thus, transistors 64–66 essentially function as one large resistive element having a relatively low resistance as compared to device 63. Alternatively, the gates of devices 64–66 can be grounded and the gate of device 63 connected to the analog reference voltage $V_{RR}$. In other words, instead of making the large device (i.e., small resistance) variable, the smaller device (i.e., large resistance) can provide the variable resistance component.

Recognize that the idea of using a parallel combination of field-effect devices as a load can also be extended to implement multiple parallel NMOS transistors as an accurate, variable current source. This embodiment is shown in FIG. 9. In FIG. 9 transistors 71–74 are coupled in parallel between node 32 and negative supply potential $V_{SSE}$. Each of transistors 71–74 has its gate coupled to the reference potential $V_{II}$. The potential $V_{II}$ is typically generated as a fixed reference voltage. Alternatively, the potential $V_{II}$ can be generated by the feedback circuit shown in FIG. 4.

It is appreciated that the multiple parallel NMOS transistor circuit of FIG. 9 can also be employed as an alternative to the multiple parallel PMOS transistors of FIGS. 7 and 8. Another possibility, of course, is to utilize the circuit of FIG. 9 in combination with the embodiments of FIGS. 7 and 8 to provide improved linear operation.

Yet another alternative is to connect the gates of transistors 64–66 in FIG. 8 to the positive supply potential $V_{DDE}$. At the same time, the gate of device 63 is connected to the variable voltage $V_{RR}$. In this configuration, transistors 64–66 are effectively removed from the DC operation of the circuit (i.e., devices 64–66 are off). This leaves the relatively small PMOS device 63 to provide a large, variable resistance. In this low power configuration, the width of PMOS load transistor 63 is effectively reduced such that a higher gate voltage is required to maintain the operating current, thus preserving linearity. Note that the problem of low current nonlinearity is alleviated in this situation by maintaining a larger gate voltage, even at low currents. Requiring a larger gate voltage provides an advantage for certain low power circuits in that it reduces the sensitivity of the logic gate to voltage drops along the metal supply lines.

The problem of unwanted voltage drops appearing along control and supply lines distributed throughout the circuit is ubiquitous in the field of integrated circuits. For example, unwanted voltage drops along the metal lines which provide the control voltage $V_{RR}$ can lead to serious problems when that signal is distributed over an entire chip. This problem is solved by the embodiment of FIG. 10 which controls the range of the analog control voltage such that—similar to a digital signal—it operates in a favorable and noise immune bias situation. For example, 100 mV of noise on the $V_{RR}$ line typically translates to about 20 to 30 mV of noise at the output of a logic gate.

The network of FIG. 10 again comprises a set of parallel PMOS devices coupled between node 30 and supply line 59. However, each of the PMOS transistors 75–78 shown in FIG. 10 has its control gate coupled to a separate digital control voltage. By way of example, device 75–78 have their gates coupled to control voltages $V_{RR1}$–$V_{RR4}$, respectively. Whenever the control voltage connected to the gate of a particular PMOS device is logically high, the device is turned off. When the gate voltage is logically low, the gate is turned on and it contributes to the total resistance of the PMOS network. Thus, the configuration of FIG. 10 allows the load resistance to be altered in discreet steps by adjusting the control voltages driving the PMOS load network.

Recognize that the PMOS load network may comprise any number of devices—coupled in a variety of series or parallel configurations. Furthermore, devices 75–78 may all be of the same size, or may be implemented as a combination of different relative device sizes. FIG. 10 shows the currently preferred device size combination wherein device 75 has a fixed size (denoted as size=X), device 76 has a size 2X, device 77 has a size 4X, and device 78 has a size 8X larger than device 75. This particular combination of device sizes provides the user with equal increments of 16 different resistance values.

The gate voltage of each PMOS device shown in FIG. 10 is normally set to two different values: One value in which the PMOS device is turned off, and the other value where the PMOS device is turned on and operates in its linear region. A straightforward implementation is to select the supply voltages $V_{DD}$ and $V_{SSE}$ as the two control voltages. An ordinary switching network, comprising a simple decoder or function generator, can then be employed as the digital switching controller. It is appreciated that the embodiment of FIG. 10 greatly simplifies the bias control circuitry needed while still maintaining a high degree of linearity over the load elements. Note that the embodiment of FIG. 10 provides extreme linear operation since if a given device is turned on, the gate to source voltage is very large.

Another possibility for driving the gates of devices 75–78 is to switch the control voltage from $V_{DDE}$ to a low control voltage derived by a feedback network such that the resistance of the PMOS network is independent of temperature, supply, and process variations. An implementation of this latter approach is shown in the circuit schematic diagram of FIG. 11.

The circuit of FIG. 11 comprises a digital switching network which includes CMOS inverters 86–88. Inverters 86–88 each comprise a series connection of PMOS and NMOS transistors having their gates commonly coupled to a digital input code signal $V_K$. For example, inverter 86 is driven by input code signal $V_{K1}$, inverter 87 by $V_{K2}$ and inverter 88 by $V_{K3}$. Depending on whether the input code signal is logically high or logically low, each of the CMOS inverters 86-88 provide an output $V_{RR}$ which switches from either $V_{DDE}$ or the voltage $V_{RRA}$, provided at node 80. The voltage $V_{RRA}$ is generated at the output of operational amplifier 53 and is derived by comparing a reference voltage $V_S$ with the feedback voltage generated at node 30 of the logic gate circuit. Note that bipolar transistor 21 has its emitter coupled to node 32. Current source 89 is also coupled to node 30 and provides the bias current to the network's common drain node. Analogous to the previous embodiments of FIGS. 1-6, the voltage $V_S$ is utilized to dynamically control the output swing of the BiCMOS logic gate of the present invention.

The circuit schematic diagram of FIG. 10 also illustrates the outputs of each of the CMOS inverters being connected to a corresponding gate of the PMOS load transistors 81-83. For instance, inverter 86 provides the output voltage $V_{RR1}$, which is coupled to the gate of PMOS transistor 81, inverter 87 provides output signal $V_{RR2}$, coupled to the gate of transistor 82, and inverter 88 provides output signal $V_{RR}$, coupled to the gate of PMOS transistor 83. Each of the PMOS transistor are coupled between the supply line $V_{DDE}$ and node 30 of the basic logic circuit. The relative device sizes of transistors 81-83 are preferably set to be a power of 2 of each other, thereby providing a fully digital range of resistance values. By way of example, in FIG. 11 the three transistors 81-83 provide $2^3$, or eight, different resistance values. In this configuration, device 81 has a relative device size equal to X, device 82 has a size equal to 2X, and device 83 has a size equal to 4X. In general, for N (where N is an integer) PMOS load transistors, there are $2^N$ possible resistance values that can be realized in this scheme.

The basic concept of the circuit of FIG. 11 is to provide a digital switching control network which drives a PMOS load network. In this case, a digital code (provided by ordinary amplifiers or decoder devices) supplies the inputs to the CMOS inverters. The feedback potential $V_{RRA}$ controls the low voltage output by the inverters, whereas the supply potential $V_{DDE}$ provides the high output level. These CMOS inverter output levels are coupled to the inputs of the PMOS load network.

Consider what happens when a digital code $V_{K1}$, $V_{K2}$, $V_{K3}$ (=101) is input to the CMOS inverter network. In this case, the outputs of inverters 86 and 88 is low (i.e., $V_{RR1}=V_{RR3}=V_{RRA}$) and the output of inverter 87 is high (i.e., $V_{RR2}=V_{DDE}$). Under these conditions, PMOS transistors 81 and 83 will be turned on and device 82 will be off. Thus, in this example devices 81 and 83 contribute to the total linear resistance of the PMOS network.

Practitioners will appreciate that generating the analog feedback voltage $V_{RRA}$ for the circuit of FIG. 11 provides compensation to changes in temperature, supply voltage, and process variations. This allows the output voltage swing of the BiCMOS gate to be set independently of such external variations. Obviously, this feature is important for maintaining ECL compatible output logic levels over a range of temperatures and voltage supplies. In addition, the control voltage $V_S$ allows the output voltage swing to vary dynamically on a real-time basis.

Although the present invention has been described in conjunction with certain embodiments, it is appreciated that the invention may be implemented in a variety of other ways. By way of example, other circuit means for implementing feedback to control the resistance of the load PMOS transistors are possible. Also, certain embodiments may find it useful to implement the circuit using PNP bipolar transistors as switching devices instead of NPN transistors. In this case, NMOS rather than PMOS transistors would be used as the current source element. Similar complementary versions of each disclosed gate and feedback control circuit are considered obvious to one skilled in the art in view of the present invention.

Consequently, it is to be understood that the particular embodiments shown and described by way of illustration are no way intended to be considered limiting. Reference to the details of these embodiments is not intended to limit the scope of the claims which themselves recite only those features regarded as essential to the invention.

We claim:

1. An improved BiCMOS logic circuit which includes an emitter-coupled pair of bipolar transistors for differentially comparing an input signal with a first reference potential, each of said bipolar transistors being coupled to a resistive load network, wherein the improvement comprises:
   a plurality of metal-oxide-semiconductor (MOS) transistors coupled in parallel between a first operating potential and the collector of each bipolar transistor, at least one of said MOS transistors providing a fixed resistance and at least one other of said MOS transistors being linearly-operated and having its gate coupled to a variable control voltage to provide a variable resistance thereof, the parallel combination of said MOS transistors improving the linearity of said circuit.

2. The logic circuit of claim 1 wherein said MOS transistors comprise p-channel (PMOS) devices.

3. The logic circuit of claim 1 wherein said MOS transistors comprise n-channel (NMOS) devices.

4. The logic circuit of claim 2 wherein said at least one of said PMOS transistors has its gate coupled to a second operating potential, said second operating potential being lower than said first operating potential.

5. The logic circuit of claim 2 wherein said at least one of said PMOS transistors has its gate coupled to said first operating potential.

6. The circuit of claim 5 wherein said variable resistance is relatively high as compared to said fixed resistance.

7. The circuit of claim 4 wherein said fixed resistance is relatively high as compared to said variable resistance.

8. The circuit of either claim 6 or 7 further comprising an amplifier for generating said control voltage, said amplifier adjusting said control voltage to maintain a constant logic swing across said resistive load network over a temperature range.

9. The circuit of claim 8 wherein said logic swing is ECL-compatible.

10. The circuit of claim 8 wherein said first operating potential comprises the highest positive supply potential coupled to said circuit, and said second operating potential comprises the lowest supply potential.

11. An improved BiCMOS logic circuit which includes an emitter-coupled pair of bipolar transistors for differentially comparing an input control signal with a first reference potential, each of said bipolar transistors being loaded by a linearly-operated p-channel metal-oxide-semiconductor (PMOS) transistor coupled between its collector and a first operating potential, the gates of said field-effect transistors being coupled to a second reference potential which determines the load resistance of said circuit, said circuit further comprising a means for biasing said emitter-coupled pair, said biasing means comprising a plurality of n-channel metal-oxide-semiconductor (NMOS) transistors coupled in parallel between the emitters of said emitter-coupled pair and said second operating potential, at least one of the gates of said NMOS transistors being coupled to a control signal which regulates the switching current provided by said biasing means to said emitter-coupled pair.

12. The logic circuit of claim 11 further comprising an amplifier for generating said control signal, said amplifier adjusting said control signal to maintain a constant logic swing across said load resistance.

13. The logic circuit of claim 12 wherein said logic swing is ECL compatible.

14. The logic circuit of claim 13 wherein said first operating potential comprises the highest positive supply potential coupled to said circuit and said second operating potential comprises the lowest supply potential coupled to said circuit.

15. The logic circuit of claim 13 wherein at least one of said NMOS transistors has its gate coupled to said second operating potential thereby providing a fixed current component of said switching current.

16. An improved BiCMOS logic circuit which comprises:
   an emitter-coupled pair of bipolar transistors for differentially comparing an input signal with a first reference potential;
   a current source means for biasing said emitter-coupled pair;
   a means for resistively loading each of said bipolar transistors;
   said loading means comprising a plurality of N, where N is an integer, MOS transistors coupled in parallel, the Nth transistor in said set providing a relative resistance calculated as $2^N$, said MOS transistors being coupled in parallel between a first operating potential and the collector of one said bipolar transistors; and
   a digital switching means for activating selected ones of said MOS transistors to provide a predetermined load resistance to one of said bipolar transistors, said switching means activating a selected MOS transistor by coupling a high voltage to its gate.

17. The circuit of claim 16 wherein said MOS transistors comprise p-channel (PMOS) devices.

18. The circuit of claim 16 wherein said MOS transistors comprise n-channel (NMOS) devices.

19. The circuit of claim 17 wherein said high voltage is approximately equal to said first operating potential.

20. The logic circuit of claim 17 wherein each of said PMOS transistors has a different relative device size.

21. The logic circuit of claim 20 wherein said switching means comprises a parallel connection of N inverters, each of said inverters providing either said operating potential or a controlled voltage signal to the gates of corresponding ones of said set of PMOS transistors, wherein said control voltage signal is less than said first operating potential.

22. The logic circuit of claim 21 further comprising an amplifier for generating said controlled voltage signal, said amplifier adjusting said control voltage signal to maintain a constant logic swing across said plurality of PMOS transistors.

23. A BiCMOS logic circuit comprising;
   an emitter-coupled pair of bipolar transistors for differentially comparing an input signal with a first reference potential;
   a means for loading each of said bipolar transistors, said loading means comprising a pair of linearly-operated metal-oxide-semiconductor transistors, each of said MOS transistors being coupled between the collector of a corresponding bipolar transistor of said emitter-coupled pair and a first operating potential, the gates of said MOS transistors being coupled to a second reference potential;
   a first biasing means for biasing said emitter-coupled pair; and
   a circuit means providing a control signal to said first biasing means for controlling the current flow through said emitter-coupled pair, said current flow also determining the load resistance presented by said MOS transistors.

24. The logic circuit of claim 23 wherein said MOS transistors comprise p-channel (PMOS) devices.

25. The logic circuit of claim 23 wherein said MOS transistors comprise n-channel (NMOS) devices.

26. The logic circuit of either claim 24 or 25 wherein said circuit means is coupled to a third reference potential which determines the output swing of said logic circuit.

27. The logic circuit of claim 26 further comprising:
   an emitter follower transistor having its base coupled to the collector of one of said bipolar transistors to provide an ECL-compatible output logic swing; and
   a second biasing means for biasing said emitter follower transistor.

28. The logic circuit of claim 27 wherein said control signal maintains the ECL compatibility of said output swing over temperature, supply and process variations.

29. The logic circuit of claim 23 wherein said PMOS transistors are matched.

30. The logic circuit of claim 28 wherein said first biasing means comprises a first n-channel metal-oxide-semiconductor (NMOS) transistor coupled between said emitter-coupled pair and a second operating potential, said first NMOS transistor having its gate coupled to receive said control signal.

31. The logic circuit of claim 30 wherein said circuit means comprises a reference PMOS transistor having its gate coupled to said second reference potential, and an amplifier means for generating said control signal from a comparison of the drain potential of said reference PMOS transistor and said second reference potential, said amplifier means adjusting said control signal so that said drain potential is approximately equal to said second reference potential.

32. The logic circuit of claim 31 wherein said circuit means further comprises a second NMOS transistor coupled between said reference PMOS transistor and said second operating potential, said second NMOS transistor having its gate coupled to receive said control signal.

33. The logic circuit of claim 32 wherein said amplifier means comprises an operational amplifier.

34. The logic circuit of claim 33 wherein said reference PMOS transistor is matched to said PMOS transistors, and said first and second NMOS transistors are matched.

* * * * *

UNITED STATES PATENT AND TRADEMARK OFFICE
CERTIFICATE OF CORRECTION

PATENT NO.   :   5,283,479
DATED        :   February 1, 1994
INVENTOR(S)  :   Geert ROSSEEL, et al.

It is certified that error appears in the above-identified patent and that said Letters Patent is hereby corrected as shown below:

Column 12, line 32, delete "thereof" and insert --therefor--.

Signed and Sealed this

Nineteenth Day of July, 1994

Attest:

BRUCE LEHMAN

*Attesting Officer*     *Commissioner of Patents and Trademarks*